United States Patent
Huang et al.

(10) Patent No.: US 10,594,221 B1
(45) Date of Patent: Mar. 17, 2020

(54) POWER SUPPLY DEVICE AND A POWER SUPPLY METHOD

(71) Applicant: Chicony Power Technology Co., Ltd., New Taipei (TW)

(72) Inventors: Wen-Nan Huang, New Taipei (TW); Shiu-Hui Lee, New Taipei (TW)

(73) Assignee: Chicony Power Technology Co., Ltd., New Taipei (TW)

( * ) Notice: Subject to any disclaimer, the term of this patent is extended or adjusted under 35 U.S.C. 154(b) by 0 days.

(21) Appl. No.: 16/584,798

(22) Filed: Sep. 26, 2019

(30) Foreign Application Priority Data

Jun. 19, 2019 (TW) .............................. 108121256 A

(51) Int. Cl.
| | | |
|---|---|---|
| H02M 3/335 | (2006.01) | |
| G03G 15/00 | (2006.01) | |
| H02J 9/06 | (2006.01) | |
| G01R 19/04 | (2006.01) | |
| H02M 7/217 | (2006.01) | |
| H02M 1/00 | (2006.01) | |

(52) U.S. Cl.
CPC ........ H02M 3/33507 (2013.01); G01R 19/04 (2013.01); G03G 15/5004 (2013.01); H02J 9/061 (2013.01); H02M 7/2176 (2013.01); H02M 2001/0022 (2013.01); H02M 2001/0025 (2013.01); H02M 2001/0032 (2013.01)

(58) Field of Classification Search
CPC ....... H02M 7/2176; H02M 2001/0022; H02M 2001/0025; H02M 2001/0032
See application file for complete search history.

(56) References Cited

U.S. PATENT DOCUMENTS

| | | | |
|---|---|---|---|
| 6,396,252 B1 * | 5/2002 | Culpepper | ............ H02M 3/156 323/225 |
| 9,413,250 B2 * | 8/2016 | Zhao | ................. H02M 3/33553 |
| 9,543,847 B2 | 1/2017 | Karlsson et al. | |
| 9,584,033 B1 * | 2/2017 | Huang | ............... H02M 3/33546 |
| 9,590,415 B2 * | 3/2017 | Wang | ........................ H02H 3/20 |
| 9,899,858 B2 * | 2/2018 | Chen | ........................ H02J 7/007 |
| 10,141,830 B1 * | 11/2018 | Chung | ..................... H02M 1/08 |
| 10,355,600 B1 * | 7/2019 | Chiu | ........................ H02M 1/32 |

(Continued)

FOREIGN PATENT DOCUMENTS

| | | |
|---|---|---|
| CN | 203840221 | 9/2014 |
| CN | 104917414 | 9/2015 |

(Continued)

*Primary Examiner* — Yusef A Ahmed
(74) *Attorney, Agent, or Firm* — JCIPRNET

(57) ABSTRACT

A power supply device and a power supply method are provided. The power supply device is configured to generate a first feedback signal according to an output power source, and operate in a skip mode (or called burst mode) according to the first feedback signal. The power supply device is configured to obtain an overall efficiency according to an input power and an output power, and obtain a difference between the overall efficiency and a preset efficiency. When an output current value of the output power source is within a predetermined range and the difference is greater than a first value, the power supply device generates a second feedback signal and stops operating in the skip mode according to the second feedback signal.

11 Claims, 6 Drawing Sheets

(56) References Cited

U.S. PATENT DOCUMENTS

| | | | |
|---|---|---|---|
| 2003/0042879 A1* | 3/2003 | Huh | H02M 3/33523 323/282 |
| 2004/0174152 A1 | 9/2004 | Hwang et al. | |
| 2009/0284994 A1* | 11/2009 | Lin | H02M 3/335 363/21.13 |
| 2010/0219802 A1* | 9/2010 | Lin | H02M 3/33507 323/284 |
| 2010/0264893 A1* | 10/2010 | Li | H02J 1/10 323/282 |
| 2011/0085354 A1* | 4/2011 | Wang | H02M 1/4225 363/21.02 |
| 2011/0095731 A1* | 4/2011 | Zhao | H02M 1/4225 323/205 |
| 2013/0107585 A1* | 5/2013 | Sims | H02M 3/33592 363/21.14 |
| 2014/0198537 A1* | 7/2014 | Kimura | H02M 3/33507 363/17 |
| 2015/0070945 A1* | 3/2015 | Huang | H02H 7/1213 363/21.16 |
| 2015/0244274 A1* | 8/2015 | Fahlenkamp | H02M 3/33507 363/21.15 |
| 2015/0349645 A1 | 12/2015 | Wei et al. | |
| 2016/0099639 A1* | 4/2016 | Leisten | H02M 3/3376 323/271 |
| 2016/0181932 A1* | 6/2016 | Kikuchi | H02M 3/33523 363/21.07 |
| 2016/0276931 A1* | 9/2016 | Trichy | H02M 3/158 |
| 2017/0149341 A1* | 5/2017 | Okayama | H02M 1/08 |
| 2017/0201088 A1* | 7/2017 | Huang | H02H 3/20 |
| 2018/0019677 A1* | 1/2018 | Chung | H02M 3/155 |
| 2019/0103809 A1* | 4/2019 | Yang | H02M 3/158 |
| 2019/0199222 A1* | 6/2019 | Lin | H02M 3/33507 |
| 2019/0222128 A1* | 7/2019 | Hirano | H02M 1/08 |

FOREIGN PATENT DOCUMENTS

| | | |
|---|---|---|
| CN | 106208671 | 12/2016 |
| TW | I460972 | 11/2014 |
| TW | I530076 | 4/2016 |
| TW | I577119 | 4/2017 |

* cited by examiner

POWER SUPPLY DEVICE AND A POWER SUPPLY METHOD

CROSS-REFERENCE TO RELATED APPLICATION

This application claims the priority benefit of Taiwan application serial no. 108121256, filed on Jun. 19, 2019. The entirety of the above-mentioned patent application is hereby incorporated by reference herein and made a part of this specification.

TECHNICAL FIELD

The invention relates to a power supply device and a power supply method, and more particularly, relates to a power supply device and a power supply method capable of controlling power supply modes.

BACKGROUND

With the increasing requirements for environmental protection and energy saving, for the power supply device in a standby mode or in a load state close to the standby mode (referred to as a light load state), skip mode control (or called burst mode control) is one of the solutions commonly used for improving an efficiency of the power supply device in the light load state. Most of the existing power supply devices have the function of the skip mode control.

An external system (i.e., an external load) may have a corresponding efficiency requirement and a power characteristic requirement of the load within a specific load range. For example, ripples may need to be reduced within the specific load range. Said efficiency requirement may be improved by the skip mode control. However, when the efficiency of the power supply device operating in the skip mode is significantly higher than the efficiency requirement of the load, the load of the power supply device within the mentioned specific load range may lead to a negative impact instead (e.g., noises being generated or ripples being amplified inside the load or the power supply device). Consequently, the power characteristic requirement of the load cannot be satisfied. Therefore, in order to satisfy the power characteristic requirement of the load, a balance between the efficiency of the power supply device and an efficiency required by the load must be controlled.

SUMMARY

The invention provides a power supply device and a power supply method for balancing the efficiency required by the load with the efficiency of the power supply device in the light load state.

The power supply device of the invention includes an input power source detection circuit, a converter, an output power source detection circuit, a feedback unit, a conversion control circuit and a mode control circuit. The input power source detection circuit is configured to detect an input power source to obtain an input power. The converter is configured to convert the input power source to generate an output power source. The output power source detection circuit is configured to detect the output power source to obtain an output power. The feedback unit is configured to generate a first feedback signal according to the output power source. The conversion control circuit is coupled to the converter and the feedback unit. The conversion control circuit is configured to control the converter to operate in the skip mode according to the first feedback signal. The mode control circuit is coupled to the conversion control circuit, the input power source detection circuit and the output power source detection circuit. The mode control circuit is configured to obtain an overall efficiency according to an input power and an output power, and obtain a difference between the overall efficiency and a preset efficiency. When an output current value of the output power source is within a predetermined range and the difference is greater than a first value, the mode control circuit generates a second feedback signal to the conversion control circuit so that the conversion control circuit controls the converter to stop operating in the skip mode according to the second feedback signal.

The power supply method of the invention is adapted to control an operating mode of a converter. The power supply method includes: detecting an input power source to obtain an input power, and detecting an output power source to obtain an output power; generating a first feedback signal according to the output power source, and controlling the converter to operate in a skip mode according to the first feedback signal; obtaining an overall efficiency according to the input power and the output power, and obtaining a difference between the overall efficiency and a preset efficiency; and generating a second feedback signal when an output current value of the output power source is within a predetermined range and the difference is greater than a first value, and controlling the converter to stop operating in the skip mode according to the second feedback signal.

Based on the above, the power supply device and the power supply method of the invention can generate the first feedback signal according to the output power source, and control the converter to operate in the skip mode according to the first feedback signal. When the output current value of the output power source is within the predetermined range and the difference is greater than the first value, the second feedback signal is generated and the converter is controlled to stop operating in the skip mode according to the second feedback signal. Accordingly, the efficiency required by the load and the efficiency of the power supply device can be balanced and can satisfy the power characteristic requirement of the load.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION

Figure 1:
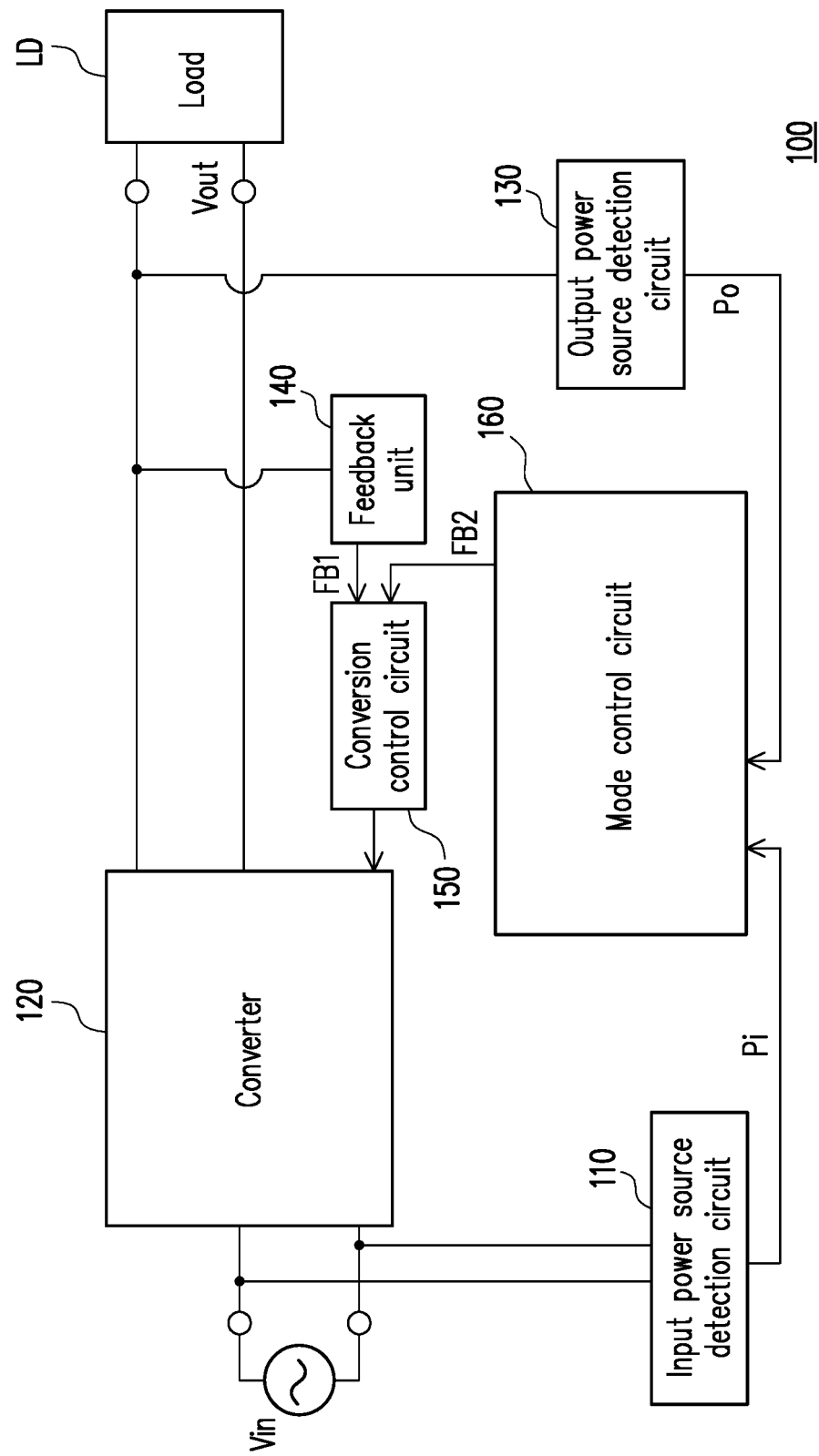
FIG. 1 is a schematic circuit diagram illustrating a power supply device according to the first embodiment of the invention.

The term "coupled (or connected)" used in this specification (including claims) may refer to any direct or indirect connection means. For example, "a first device is coupled (connected) to a second device" should be interpreted as "the first device is directly connected to the second device" or "the first device is indirectly connected to the second device through other devices or connection means". Moreover, elements/components/steps with same reference numerals represent same or similar parts in the drawings and embodiments. Elements/components/steps with the same reference numerals or names in different embodiments may be cross-referenced.

With reference to FIG. 1, FIG. 1 is a schematic circuit diagram illustrating a power supply device according to the first embodiment of the invention. In this embodiment, a power supply device 100 is configured to drive a load LD. The power supply device 100 includes an input power source detection circuit 110, a converter 120, an output power source detection circuit 130, a feedback unit 140, a conversion control circuit 150 and a mode control circuit 160. The input power source detection circuit 110 is configured to receive an input power source Vin and detect the input power source Vin to obtain an input power Pi. The converter 120 is configured to receive the input power source Vin, and convert the input power source Vin to generate an output power source Vout. The converter 120 of this embodiment may be implemented by, for example, a flyback converter. The output power source detection circuit 130 is configured to detect the output power source Vout to obtain an output power Po.

In certain implementations, under the circumstances where a voltage value of the input power source Vin is known or fixed, the input power source detection circuit 110 can detect only a current value of the input power source Vin and obtain the input power Pi according to the known or fixed voltage value of the input power source Vin. For instance, the input power source detection circuit 110 may include an input current sensing element (not illustrated) for detecting the current value of the input power source Vin. The input current sensing element may be implemented by a resistor element. The input current sensing element can provide a temperature value or a voltage value corresponding to the current value of the input power source Vin in response to the current value of the input power source Vin. Accordingly, the input power source detection circuit 110 can obtain the current value of the input power source Vin according to the temperature value or the voltage value, and obtain the input power Pi according to the known or fixed voltage value of the input power source Vin.

Similarly, in certain implementations, under the circumstances where a voltage value of the output power source Vout is known or fixed, the output power source detection circuit 130 can detect only a current value of the output power source Vout and obtain the output power Po according to the known or fixed voltage value of the output power source Vout. For instance, the output power source detection circuit 130 may include an output current sensing element (not illustrated) for detecting the current value of the output power source Vout. The output current sensing element may be implemented by a resistor element. The output current sensing element can provide a temperature value or a voltage value corresponding to the current value of the output power source Vout in response to the current value of the output power source Vout. Accordingly, the output power source detection circuit 130 can obtain the current value of the output power source Vout according to the temperature value or the voltage value, and obtain the output power Po according to the known or fixed voltage value of the output power source Vout.

The feedback unit 140 is configured to generate a first feedback signal FB1 according to the output power source Vout. The conversion control circuit 150 is coupled to the converter 120 and the feedback unit 140. The conversion control circuit 150 is configured to receive the first feedback signal FB1 provided from the feedback unit 140 and control the converter 120 according to the feedback signal FB1 so that the converter 120 is controlled to operate in a skip mode (or called a burst mode). In other words, when the power supply device 100 is in a light load state, once the first feedback signal FB1 is received by the conversion control circuit 150, the conversion control circuit 150 controls the converter 120 to improve the required efficiency of converter 120 in the light load state.

In this embodiment, the mode control circuit 160 is coupled to the conversion control circuit 150, the input power source detection circuit 110 and the output power source detection circuit 130. The mode control circuit 160 is configured to receive the input power Pi and the output power Po, and obtain an overall efficiency according to the input power Pi and the output power Po. In this embodiment, the mode control circuit 160 can use a quotient obtained by dividing the output power Po by the input power Pi as the overall efficiency described above. The mode control circuit 160 subtracts a preset efficiency required by the load LD from the overall efficiency to obtain a difference between the overall efficiency and the preset efficiency. Next, the mode control circuit 160 generates a second feedback signal FB2 to the conversion control circuit 150 when an output current value of the output power source Vout is within a predetermined range and the difference is greater than a first value so that the conversion control circuit 150 controls the converter 120 to stop operating in the skip mode according to the second feedback signal FB2.

More specifically, the mode control circuit 160 will continuously receive the input power Pi and the output power Po and continuously obtain the difference. At the timepoint when the output current value of the output power source Vout is within the predetermined range and the difference is greater than the first value, the mode control circuit 160 generates the second feedback signal FB2 to the conversion control circuit 150 so that the conversion control circuit 150 controls the converter 120 to stop operating in the skip mode according to the second feedback signal FB2.

In this embodiment, the predetermined range may be associated with the load LD. In other words, the predetermined range varies depending on the load LD. In this embodiment, the power supply device 100 can receive the predetermined range provided from the load LD.

In certain embodiments, the load LD can provide at least one load range for determining whether to stop operating in the skip mode. The mode control circuit 160 can include the at least one load range for determining whether to stop operating in the skip mode as the predetermined range. For instance, the load LD can provide a first load range with a current value of 0.8 amps to 1.0 amps and a second load range with a current value of 1.1 amps to 1.2 amps. The mode control circuit 160 can include the first load range and the second load range as the predetermined range, i.e., from 0.8 amps to 1.2 amps. As another example, the load LD can provide the first load range with a current value of 0.8 amps to 1.1 amps and the second load range with a current value of 1.0 amps to 1.2 amps. The mode control circuit 160 can combine the first load range and the second load range into the predetermined range, i.e., from 0.8 amps to 1.2 amps.

In certain embodiments, a plurality of predetermined ranges corresponding to different loads LD may be built into the mode control circuit 160. Once one specific load LD is connected to the power supply device 100, the mode control circuit 160 can select the corresponding predetermined range from the plurality of predetermined ranges.

Figure 2:
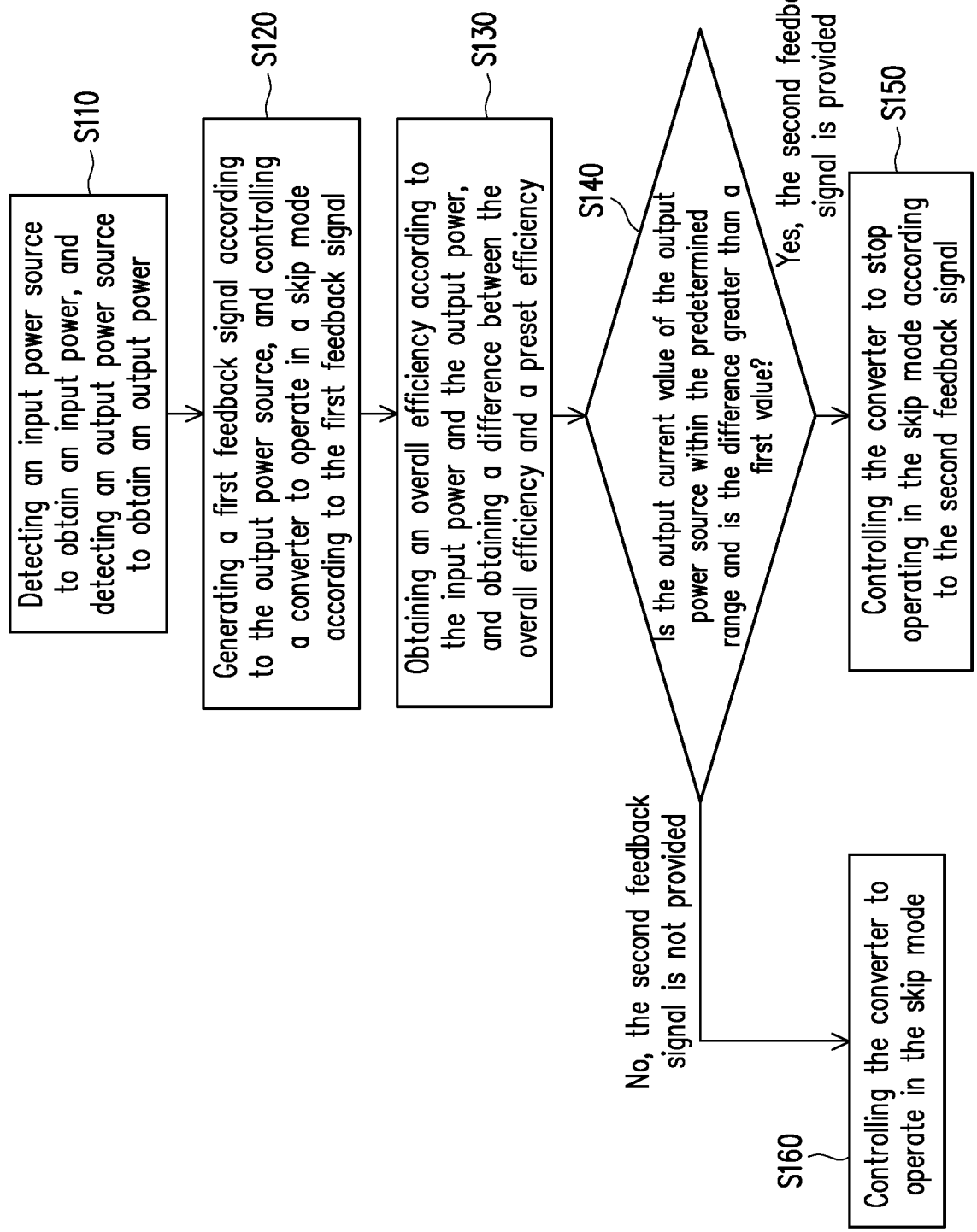
FIG. 2 is a flowchart illustrating a power supply method according to the first embodiment of the invention.

Next, an operation flow of the power supply method will be described. Referring to FIG. 1 and FIG. 2 together, FIG. 2 is a flowchart illustrating a power supply method according to the first embodiment of the invention. In this embodiment, the power supply method is adapted to the power supply device 100. Specifically, the power supply method is adapted to control an operating mode of the converter 120. In step S110, the input power source Vin is detected to obtain the input power Pi, and the output power source Vout is detected to obtain the output power Po. Specifically, the power supply device 100 detects the input power source Vin through the input power source detection circuit 110 to obtain the input power Pi, and detects the output power source Vout through the output power source detection circuit 130 to obtain the output power Po in step S110. In step S120, the first feedback signal FB1 is generated according to the output power source Vout, and the converter 120 is controlled to operate in the skip mode according to the first feedback signal FB1. Specifically, in step S120, the power supply device 100 generates the first feedback signal FB1 according to the output power source Vout through the feedback unit 140. The conversion control circuit 150 receives the first feedback signal FB1, and makes the converter 120 operate in the skip mode according to the first feedback signal FB1.

In step S130, the overall efficiency is obtained according to the input power Pi and the output power Po, and the difference between the overall efficiency and the preset efficiency is obtained. Specifically, through the mode control circuit 160, the power supply device 100 obtains the overall efficiency according to the input power Pi and the output power Po, and obtains the difference between the overall efficiency and the preset efficiency.

In step S140, the mode control circuit 160 determines whether the output current value of the output power source Vout is within the predetermined range and determines whether the difference is greater than the first value. When determining that the output current value of the output power source Vout is within the predetermined range and the difference is greater than the first value, the mode control circuit 160 generates the second feedback signal FB2 and proceeds to step S150. In step S150, the conversion control circuit 150 controls the converter 120 to stop operating in the skip mode according to the second feedback signal FB2. On the other hand, when determining that the output current value of the output power source Vout is not within the predetermined range and/or the difference is less than or equal to the first value in step S140, the mode control circuit 160 does not generate the second feedback signal FB2 and proceeds to step S160. In step S160, the conversion control circuit 150 controls the converter 120 to operate in the skip mode.

Figure 3:
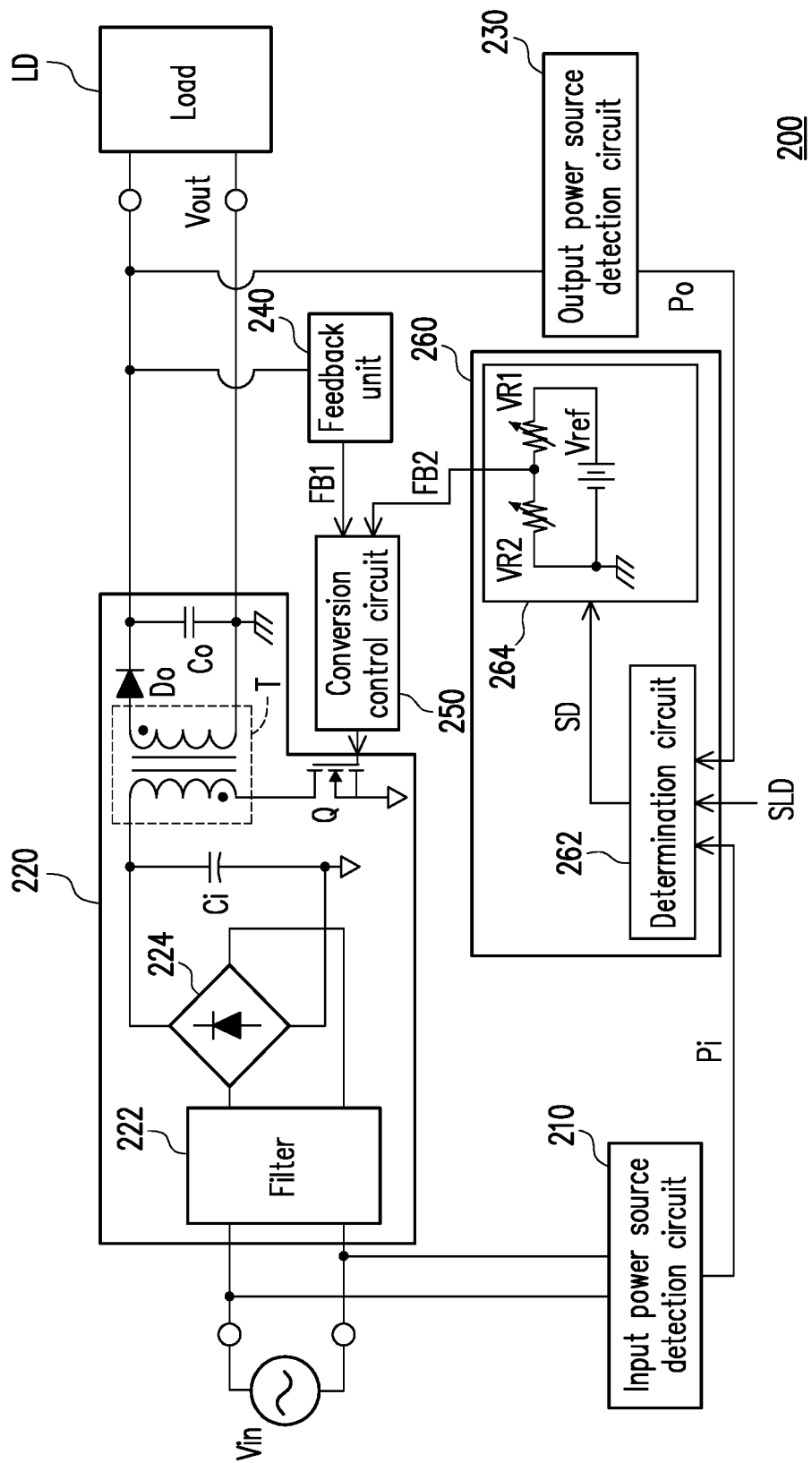
FIG. 3 is a schematic circuit diagram illustrating a power supply device according to the second embodiment of the invention.

For further explanation, with reference to FIG. 3, FIG. 3 is a schematic circuit diagram illustrating a power supply device according to the second embodiment of the invention. In this embodiment, a power supply device 200 includes an input power source detection circuit 210, a converter 220, an output power source detection circuit 230, a feedback unit 240, a conversion control circuit 250 and a mode control circuit 260. Sufficient teaching regarding a coupling manner and a cooperative operation between the input power source detection circuit 210, the converter 220, the output power source detection circuit 230, the feedback unit 240, the conversion control circuit 250 and the mode control circuit 260 may be obtained from the embodiment of FIG. 1, which is not repeated hereinafter. In this embodiment, the converter 220 includes a filter 222, a rectifier 224, an input capacitor Ci, a transformer T, an output diode Do, an output capacitor Co and a power switch Q. The filter 222 is configured to receive the input power source Vin, and filter out electromagnetic Interference (EMI) of the input power source Vin. The filter 222 is connected in parallel with the input power source detection circuit 210. The rectifier 224 is coupled to the filter 222. The rectifier 224 is configured to rectify the filtered input power source Vin to generate a rectified power source. A first terminal of the input capacitor Ci is coupled to a first terminal of the rectifier 224. A second terminal of the input capacitor Ci is coupled to a second terminal of the rectifier 224 and a first ground terminal. An opposite-polarity terminal of a first side of the transformer T is coupled to the first terminal of the rectifier 224. A first terminal of the power switch Q is coupled to a common-polarity terminal of the first side of the transformer T, i.e., a dotted terminal. A second terminal of the power switch Q is coupled to the first ground terminal. A control terminal of the power switch Q is coupled to the conversion control circuit 250. When receiving the first feedback signal FB1 without receiving the second feedback signal FB2, the conversion control circuit 250 controls the power switch Q so that the converter 220 is controlled to operate in the skip mode. On the other hand, when receiving the second feedback signal FB2, the conversion control circuit 250 controls the power switch Q so that the converter 220 is controlled to stop operating in the skip mode. The power switch Q may be implemented by at least one transistor switch. For instance, the power switch Q may be an N-type metal-oxide-semiconductor field-effect transistor (MOSFET). An anode of the output diode Do is coupled to a common-polarity terminal of a second side of the transformer T, i.e., a dotted terminal. A first terminal of the output capacitor Co is coupled to a cathode of the output diode Do, the output power source detection circuit 230 and the feedback unit 240. A second terminal of the output capacitor Co is coupled to an opposite-polarity terminal of the second side of the transformer T and a second ground terminal. The first side of the transformer T is configured to receive the rectified power source. The transformer T is configured to convert the rectified power source in response to the switching of the power switch Q. The converter 220 provides the converted rectified power source through the second side of the transformer T and provides the output power source Vout through the output diode Do and the output capacitor Co.

In this embodiment, the mode control circuit 260 includes a determination circuit 262 and a second feedback signal generator 264. The determination circuit 262 is coupled to the input power source detection circuit 210 and the output power source detection circuit 230. The determination circuit 262 is configured to receive a predetermined range SLD provided from the load LD, and determine whether the output current value is within the predetermined range SLD, and determine whether the difference is greater than the first value. A determination signal SD is provided when the determination circuit 262 determines that the output current value is within the predetermined range SLD and the difference is greater than the first value. In this embodiment, the determination circuit 262 may be, for example, a central processing unit (CPU) or other programmable devices for general purpose or special purpose such as a microprocessor and a digital signal processor (DSP), a programmable controller, an application specific integrated circuit (ASIC), a programmable logic device (PLD) or other similar devices or a combination of above-mentioned devices.

The second feedback signal generator 264 is coupled to the determination circuit 262 and the conversion control circuit 250. The second feedback signal generator 264 is configured to generate the second feedback signal FB2 according to the determination signal SD.

In this embodiment, the second feedback signal generator 264 includes a first impedance generator VR1 and a second impedance generator VR2. A first terminal of the first impedance generator VR1 is coupled to a reference voltage source Vref. A first terminal of the second impedance generator VR2 is coupled to a second terminal of the first impedance generator VR1. The first terminal of the second impedance generator VR2 is configured to output the second feedback signal FB2. A second terminal of the second impedance generator VR2 is coupled to a reference low potential (e.g., the second ground terminal). In this embodiment, the first impedance generator VR1 generates a first impedance according to the determination signal SD. The second impedance generator VR2 generates a second impedance according to the determination signal SD. The second feedback signal generator 264 generates the second feedback signal FB2 by dividing the reference voltage source Vref according to the first impedance and the second impedance.

For instance, when the second feedback signal generator 264 does not receive the determination signal SD, the second feedback signal generator 264 provides a higher first impedance and a lower second impedance. Therefore, the second feedback signal generator 264 provides a low voltage level signal. When the second feedback signal generator 264 receives the determination signal SD, the second feedback signal generator 264 provides a lower first impedance and a higher second impedance according to the determination signal SD. Therefore, the second feedback signal generator 264 provides a high voltage level signal, i.e., the second feedback signal FB2. As another example, when the second feedback signal generator 264 does not receive the determination signal SD, the second feedback signal generator 264 provides a lower first impedance and a higher second impedance. Therefore, the second feedback signal generator 264 provides a high voltage level signal. When the second feedback signal generator 264 receives the determination signal SD, the second feedback signal generator 264 provides a higher first impedance and a lower second impedance according to the determination signal SD. Therefore, the second feedback signal generator 264 provides a low voltage level signal, i.e., the second feedback signal FB2.

In this embodiment, the power supply device 200 of the present embodiment may also be adapted to the power supply method described in FIG. 2.

Figure 4:
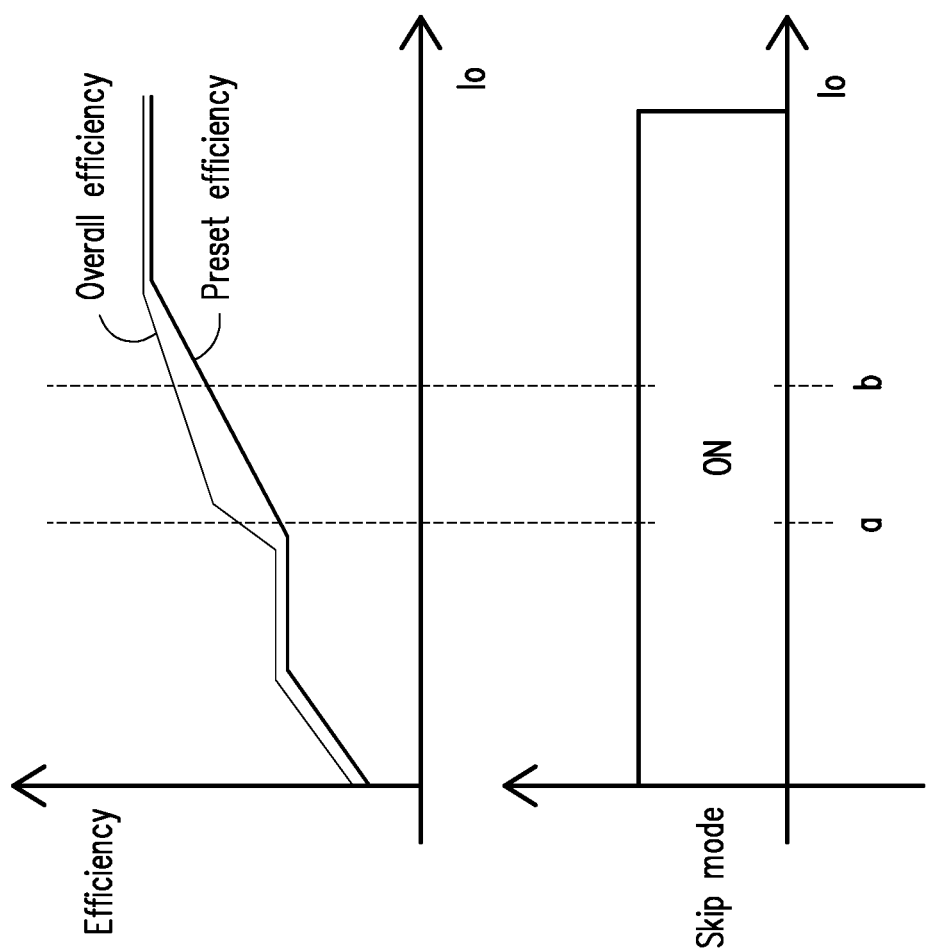
FIG. 4 is a schematic diagram illustrating an efficiency performance of the existing power supply device operating in the skip mode.

With reference to FIG. 4, FIG. 4 is a schematic diagram illustrating an efficiency performance of the existing power supply device operating in the skip mode. In FIG. 4, once the existing power supply device is operating in the skip mode (i.e., "ON") in the light load state, the efficiency of the power supply device is improved. Nonetheless, in the case where the power supply device continues to operate in the skip mode, the overall efficiency of the power supply device may be significantly greater than the preset efficiency required by the load within the specific load range. For instance, when an output current value Io is within a load range between a current value a and a current value b, the overall efficiency of the power supply device is significantly greater than the preset efficiency required by the load. Consequently, for the power supply device 100 within the load range between the current value a and the current value b, the efficiency of the power supply device and the efficiency required by the load are unbalanced. Apart from this, a power characteristic requirement of the load LD within the above load range may not be satisfied.

Figure 5:
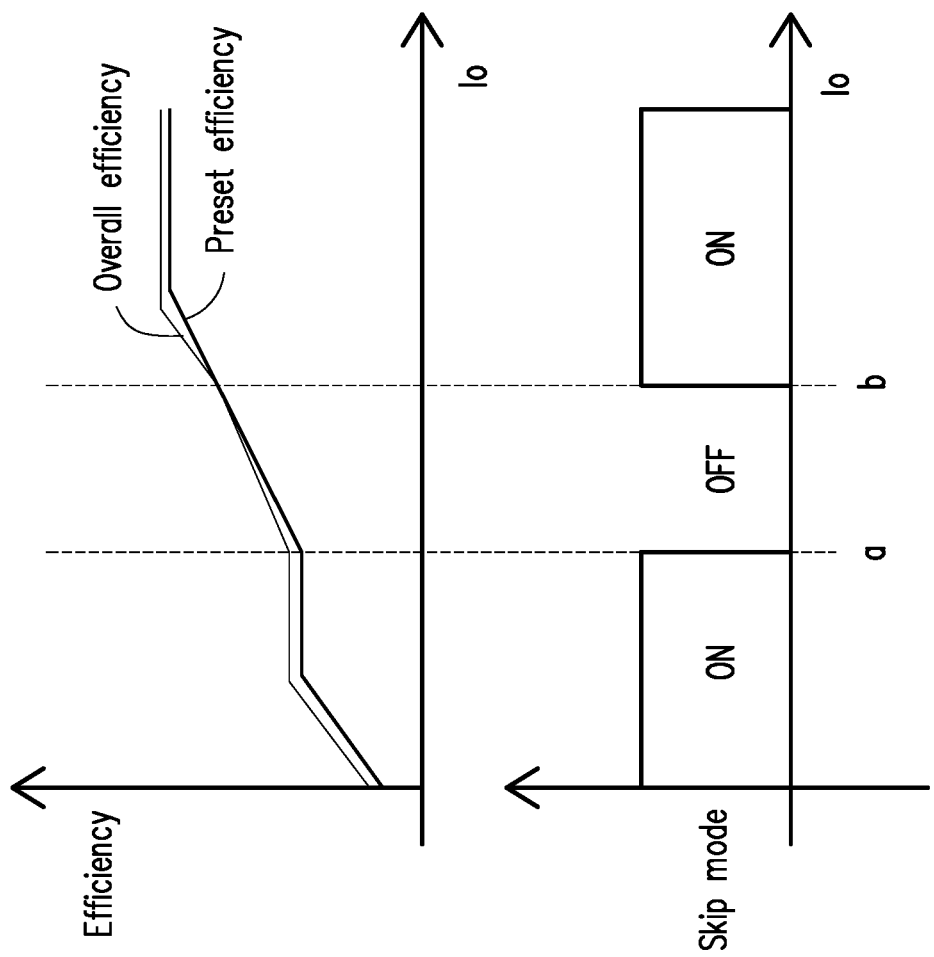
FIG. 5 is a schematic diagram illustrating an efficiency performance according to an embodiment of the invention.

Referring to FIG. 1 and FIG. 5 together, FIG. 5 is a schematic diagram illustrating an efficiency performance according to an embodiment of the invention. In FIG. 5, once the power supply device 100 is in the light load state, the feedback unit 140 provides the first feedback signal FB1. When the conversion control circuit 150 controls the converter 120 to operate in the skip mode (i.e., "ON") according to the first feedback signal FB1, the efficiency of the power supply device 100 will be improved. When operating in the skip mode, the mode control circuit 160 determines whether to provide the second feedback signal FB2 according to the output current value Io of the output power source Vout and the difference between the overall efficiency of the power supply device 100 and the preset efficiency required by the load. In this embodiment, when the output current value Io is within the load range between the current value a and the current value b and the difference between the overall efficiency of the power supply device 100 and the preset efficiency required by the load LD is greater than the first value, the mode control circuit 160 provides the second feedback signal FB2. The conversion control circuit 150 controls the converter 120 to stop operating in the skip mode (i.e., "OFF") according to the second feedback signal FB2.

In this embodiment, during a period in which the converter 120 is not operating in the skip mode, the mode control circuit 160 continuously obtains the difference between the overall efficiency of the power supply device 100 and the preset efficiency required by the load LD. The mode control circuit 160 further determines whether to continue to not operate in the skip mode according to the difference described above. For instance, during the period in which the converter 120 is not operating in the skip mode, if the difference is greater than the second value, the mode control circuit 160 provides the second feedback signal FB2. The conversion control circuit 150 controls the converter 120 to continue not operating in the skip mode (i.e., "OFF") according to the second feedback signal FB2. On the other hand, if the difference is less than or equal to the second value, the mode control circuit 160 does not provide the second feedback signal FB2 so the converter 120 operates in the skip mode (i.e., "ON"). The second value may be, for example, 0 or a negative value slightly less than 0. In this way, by continuously determining the difference by the mode control circuit 160, the power supply device 100 can have the overall efficiency approaching to (equal or slightly greater than) the preset efficiency within the load range between the current value a and the current value b.

In this embodiment, when the output current value Io is greater than the current value b or less than the current value a, it indicates that the output current value Io is out of the above load range. Therefore, the mode control circuit 160 does not provide the second feedback signal FB2. The conversion control circuit 150 controls the converter 120 to operate in the skip mode (i.e., "ON").

In this embodiment, when the output current value Io is within the load range between the current value a and the current value b and the difference is less than the first value, the mode control circuit 160 does not provide the second feedback signal FB2. The conversion control circuit 150 controls the converter 120 to operate in the skip mode (i.e., "ON").

It should be understood that, the efficiency performance shown in FIG. 5 may also be realized by the power supply device 200 shown by FIG. 2.

Figure 6:
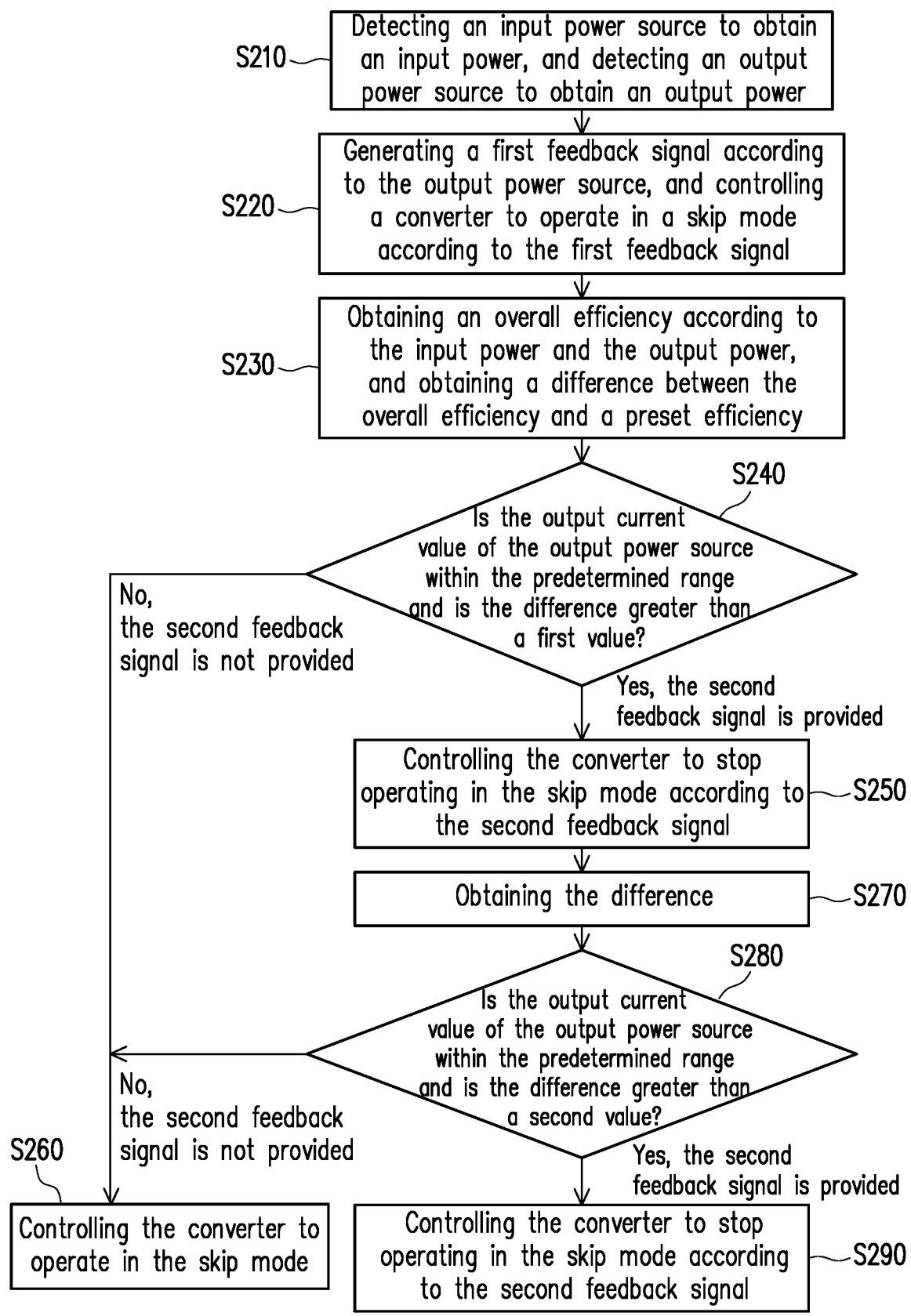
FIG. 6 is a flowchart illustrating a power supply method according to the third embodiment of the invention.

Referring to FIG. 1 and FIG. 6, FIG. 6 is a flowchart illustrating a power supply method according to the third embodiment of the invention. In step S210, the input power source Vin is detected to obtain the input power Pi, and the output power source Vout is detected to obtain the output power Po. In step S220, the first feedback signal FB1 is generated according to the output power source Vout, and the converter 120 is controlled to operate in the skip mode according to the first feedback signal FB1. In step S230, the overall efficiency is obtained according to the input power Pi and the output power Po, and the difference between the overall efficiency and the preset efficiency is obtained. In step S240, the mode control circuit 160 determines whether the output current value of the output power source Vout is within the predetermined range and determines whether the difference is greater than the first value. When determining that the output current value of the output power source Vout is within the predetermined range and the difference is greater than the first value, the mode control circuit 160 generates the second feedback signal FB2 and proceeds to step S250. On the other hand, when determining that the output current value of the output power source Vout is not within the predetermined range and/or the difference is less than or equal to the first value in step S240, the mode control circuit 160 does not generate the second feedback signal FB2 and proceeds to step S260. In step S260, the conversion control circuit 150 controls the converter 120 to operate in the skip mode.

In step S250, the conversion control circuit 150 controls the converter 120 to stop operating in the skip mode according to the second feedback signal FB2 and proceeds to step S270. In a period during which the converter 120 is not operating in the skip mode, the mode control circuit 160 can continuously obtain the difference between the overall efficiency and the preset efficiency in step S270, and further determine whether the difference between the overall efficiency of the power supply device 100 and the preset efficiency required by the load LD is greater than the second value in step S280. When determining that the difference is greater than the second value in step S280, the mode control circuit 160 generates the second feedback signal FB2 and proceeds to step S290. The conversion control circuit 150 controls the converter 120 to continue not operating in the skip mode according to the second feedback signal FB2 in step S290. On the other hand, when determining that the difference is less than or equal to the second value in step S280, the mode control circuit 160 does not generate the second feedback signal FB2 and proceeds to step S260. In step S260, the conversion control circuit 150 controls the converter 120 to operate in the skip mode.

Steps S280 and S290 are further described with reference to examples below. The second value may be, for example, 0. During the period in which the converter 120 is not operating in the skip mode, when the output current value is within the predetermined range, the mode control circuit 160 generates the second feedback signal FB2 when determining that the difference is greater than 0 (i.e., the overall efficiency is greater than the preset efficiency) in step S280. The converter 120 stops operating in the skip mode according to the second feedback signal FB2 (step S290). On the other hand, during the period in which the converter 120 is not operating in the skip mode, when the output current value is within the predetermined range, the mode control circuit 160 does not generate the second feedback signal FB2 when determining that the difference is less than or equal to 0 (i.e., the overall efficiency is less than or equal to the preset efficiency) in step S280. The converter 120 then operates in the skip mode (step S260).

In summary, the power supply device and the power supply method of the invention can generate the first feedback signal according to the output power source, and control the converter to operate in the skip mode according to the first feedback signal. When the output current value of the output power is within the predetermined range and the difference is greater than the first value, the power supply device and the power supply method can generate the second feedback signal FB2 and control the converter to stop operating in the skip mode according to the second feedback signal FB2. Accordingly, the efficiency required by the load and the efficiency of the power supply device can be balanced and can satisfy the power characteristic requirement of the load.

Although the present invention has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A power supply device, comprising:
an input power source detection circuit, configured to detect an input power source to obtain an input power;
a converter, configured to convert the input power source to generate an output power source;
an output power source detection circuit, configured to detect the output power source to obtain an output power;
a feedback unit, configured to generate a first feedback signal according to the output power source;
a conversion control circuit, coupled to the converter and the feedback unit, and configured to control the converter to operate in a skip mode according to the first feedback signal; and
a mode control circuit, coupled to the conversion control circuit, the input power source detection circuit and the output power source detection circuit, and configured to obtain an overall efficiency according to the input power and the output power and obtain a difference between the overall efficiency and a preset efficiency, wherein the mode control circuit generates a second feedback signal to the conversion control circuit when an output current value of the output power source is within a predetermined range and the difference is greater than a first value so that the conversion control circuit controls the converter to stop operating in the skip mode according to the second feedback signal,
wherein the mode control circuit comprises:
a determination circuit, coupled to the input power source detection circuit and the output power source detection circuit, and configured to determine whether the output current value is within the predetermined range and determine whether the difference is greater than the first value and provide a determination signal when determining that the output current value is within the predetermined range and the difference is greater than the first value; and a second feedback signal generator, coupled to the determination circuit and the conversion control circuit, and configured to generate the second feedback signal according to the determination signal, wherein the second feedback signal generator comprises:

a first impedance generator, a first terminal of the first impedance generator being coupled to a reference voltage source; and a second impedance generator, a first terminal of the second impedance generator being coupled to a second terminal of the first impedance generator, the first terminal of the second impedance generator being configured to output the second feedback signal, a second terminal of the second impedance generator being coupled to a reference low potential, wherein the first impedance generator generates a first impedance according to the determination signal, the second impedance generator generates a second impedance according to the determination signal, and the second feedback signal generator generates the second feedback signal by dividing the reference voltage source according to the first impedance and the second impedance.

2. The power supply device according to claim 1, wherein when receiving the second feedback signal, the conversion control circuit controls a power switch of the converter so that the converter is controlled to stop operating in the skip mode.

3. The power supply device according to claim 1, wherein during a period in which the converter is not operating in the skip mode, when the output current value is within the predetermined range and the difference is greater than a second value, the mode control circuit generates the second feedback signal to the conversion control circuit so that the conversion control circuit controls the converter to continue not operating in the skip mode according to the second feedback signal, wherein the second value is less than the first value.

4. The power supply device according to claim 3, wherein during the period in which the converter is not operating in the skip mode, when the output current value is within the predetermined range and the difference is less than or equal to the second value, the conversion control circuit controls the converter to operate in the skip mode.

5. The power supply device according to claim 1, wherein the mode control circuit is further configured to include at least one load range for determining whether to stop operating in the skip mode as the predetermined range.

6. The power supply device according to claim 5, wherein the at least one load range is provided by an external load.

7. A power supply method adapted to control an operating mode of a converter, the power supply method comprising:

detecting an input power source to obtain an input power, and detecting an output power source to obtain an output power;

generating a first feedback signal according to the output power source, and controlling the converter to operate in a skip mode according to the first feedback signal;

obtaining an overall efficiency according to the input power and the output power, and obtaining a difference between the overall efficiency and a preset efficiency; and generating a second feedback signal when an output current value of the output power source is within a predetermined range and the difference is greater than a first value, and controlling the converter to stop operating in the skip mode according to the second feedback signal, wherein the step of generating the second feedback signal when the output current value of the output power source is within the predetermined range and the difference is greater than the first value comprises:

providing a determination signal when determining that the output current value is within the predetermined range and the difference is greater than the first value; and generating the second feedback signal according to the determination signal, wherein the step of generating the second feedback signal according to the determination signal comprises:

generating a first impedance and a second impedance according to the determination signal; and generating the second feedback signal by dividing a reference voltage source according to the first impedance and the second impedance.

8. The power supply method according to claim 7, further comprising:

during a period in which the converter is not operating in the skip mode, generating the second feedback signal when the output current value is within the predetermined range and the difference is greater than a second value, and controlling the converter to continue not operating in the skip mode according to the second feedback signal, wherein the second value is less than the first value.

9. The power supply method according to claim 8, further comprising:

during the period in which the converter is not operating in the skip mode, controlling the converter to operate in the skip mode when the output current value is within the predetermined range and the difference is less than or equal to the second value.

10. The power supply method according to claim 7, further comprising:

including at least one load range for determining whether to stop operating in the skip mode as the predetermined range.

11. The power supply method according to claim 10, further comprising:

providing the at least one load range by an external load.

* * * * *